(12) United States Patent
Schulze et al.

(10) Patent No.: US 9,972,488 B2
(45) Date of Patent: May 15, 2018

(54) METHOD OF REDUCING DEFECTS IN AN EPITAXIAL LAYER

(71) Applicant: Infineon Technologies AG, Neubiberg (DE)

(72) Inventors: Hans-Joachim Schulze, Taufkirchen (DE); Helmut Oefner, Zorneding (DE); Johannes Baumgartl, Riegersdorf (AT)

(73) Assignee: Infineon Technologies AG, Neubiberg (DE)

( * ) Notice: Subject to any disclaimer, the term of this patent is extended or adjusted under 35 U.S.C. 154(b) by 0 days. days.

(21) Appl. No.: 15/066,262

(22) Filed: Mar. 10, 2016

(65) Prior Publication Data

US 2017/0263440 A1 Sep. 14, 2017

(51) Int. Cl.
*H01L 21/02* (2006.01)

(52) U.S. Cl.
CPC ...... *H01L 21/0243* (2013.01); *H01L 21/0242* (2013.01); *H01L 21/02381* (2013.01)

(58) Field of Classification Search
CPC .......... H01L 21/0243; H01L 21/02381; H01L 21/0242
See application file for complete search history.

(56) References Cited

U.S. PATENT DOCUMENTS

| | | | | |
|---|---|---|---|---|
| 5,218,216 A | * | 6/1993 | Manabe | H01L 33/0008 257/103 |
| 2003/0224569 A1 | * | 12/2003 | Clampitt | H01L 21/762 438/242 |
| 2004/0129941 A1 | * | 7/2004 | Dokumaci | B82Y 10/00 257/66 |
| 2010/0068866 A1 | * | 3/2010 | Yu | H01L 21/0237 438/429 |
| 2010/0327291 A1 | * | 12/2010 | Preble | C30B 25/02 257/76 |
| 2013/0256909 A1 | * | 10/2013 | Xu | H01L 21/6836 257/774 |
| 2015/0179737 A1 | * | 6/2015 | Schulze | H01L 21/3065 257/496 |
| 2015/0325645 A1 | | 11/2015 | Guo et al. | |
| 2015/0371956 A1 | | 12/2015 | Agarwal et al. | |

OTHER PUBLICATIONS

Accuratus, "Silicon Carbide, SiC", Nov. 2, 2002.*
Kyma, "Kyma Discusses the Thermal Conductivity of Their Ga Nitride Materials", Sep. 6, 2011.*

* cited by examiner

*Primary Examiner* — Benjamin Sandvik
*Assistant Examiner* — Gustavo Ramallo
(74) *Attorney, Agent, or Firm* — Dicke, Billig & Czaja, PLLC

(57) ABSTRACT

A method of reducing defects in an epitaxial layer. The method includes forming one or more barrier structures within a peripheral edge region of a wafer substrate, and forming an epitaxial layer over a surface of the wafer substrate.

18 Claims, 12 Drawing Sheets

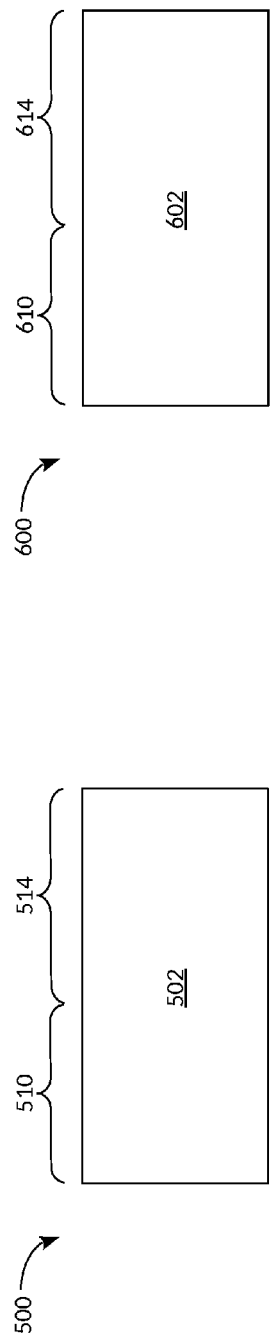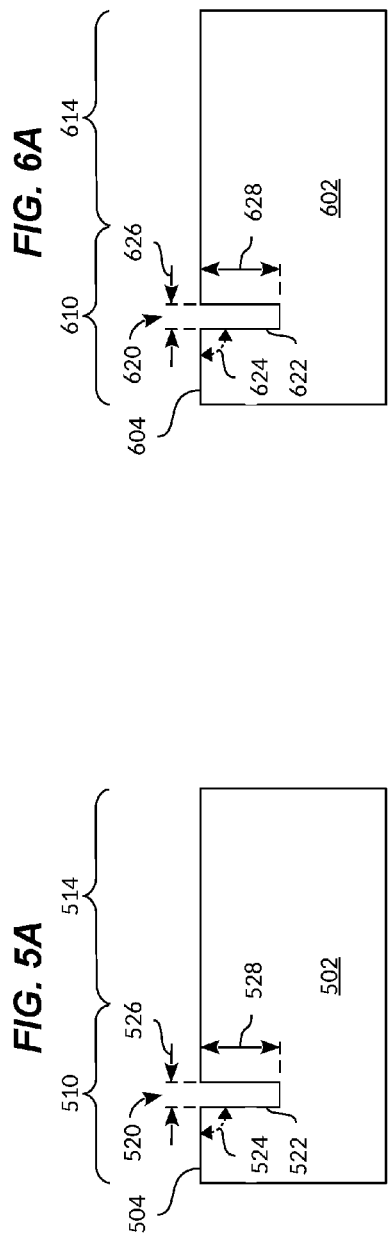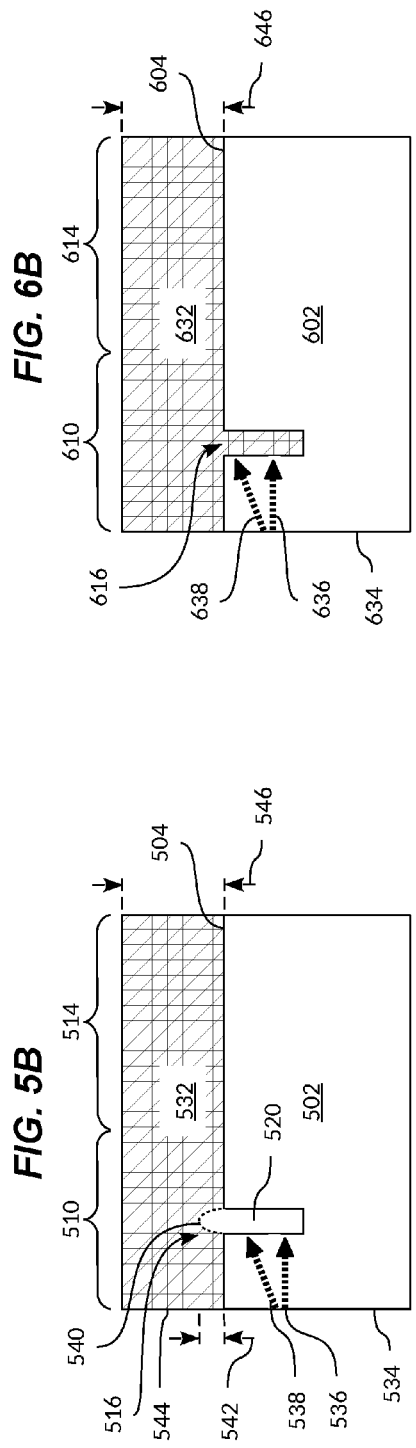

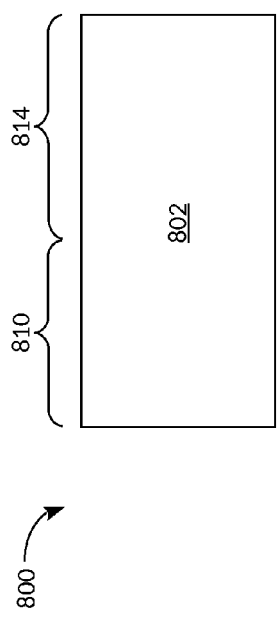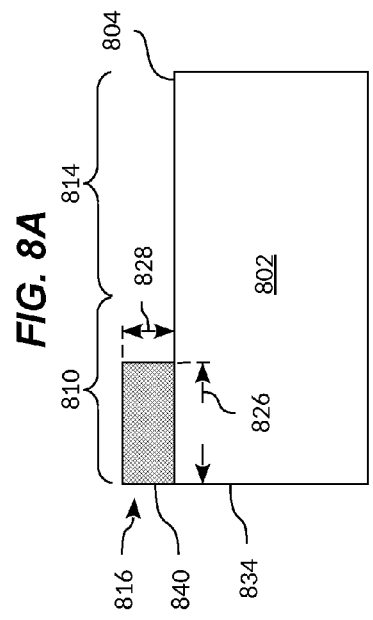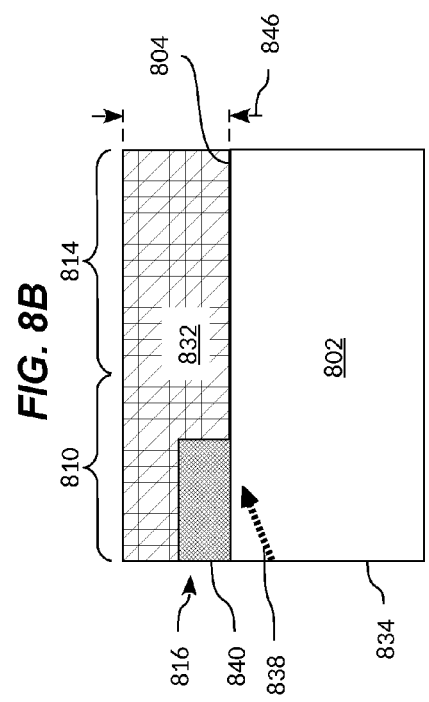

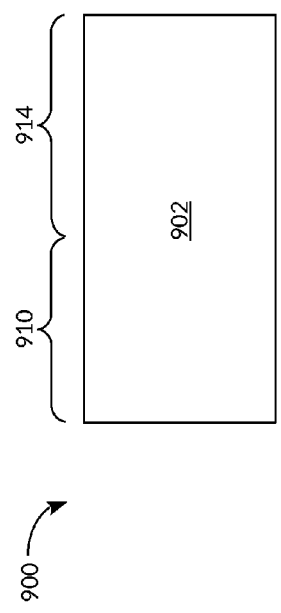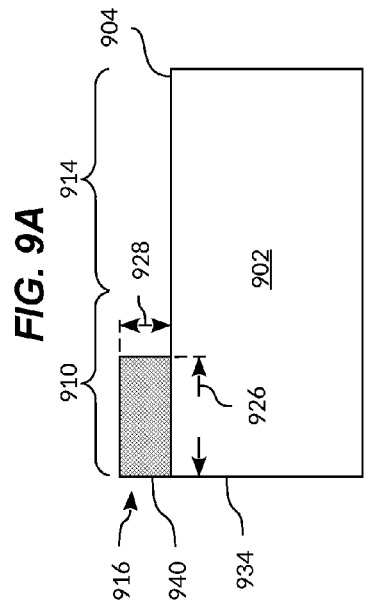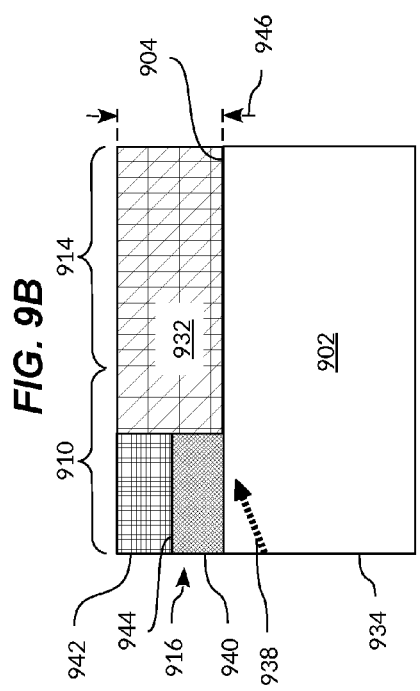

METHOD OF REDUCING DEFECTS IN AN EPITAXIAL LAYER

FIELD OF TECHNOLOGY

The present application relates to a method for reducing defects during epitaxial deposition.

BACKGROUND

Epitaxy refers to the growth by deposition of a single crystal film on top of a crystalline substrate. Epitaxial layers are used in a variety of semiconductor devices such as Insulated Gate Bipolar Transistors (IGBTs). Epitaxially grown layers are desirable for these types of devices due to having a relatively low defect density and because they can be doped independently of an underlying substrate.

Chemical vapor deposition (CVD) is a process that is used to form epitaxial layers. With CVD, a wafer substrate is exposed to gaseous precursors at high temperatures to produce the epitaxial layer. The surface of the wafer substrate acts as a seed crystal and the epitaxial layer takes on the crystalline lattice structure and lattice orientation of the surface of the substrate.

The CVD process can lead to the formation of undesired structural imperfections within the crystalline lattice structure of the wafer substrate and/or the epitaxial layer during growth. These structural imperfections typically include point defects (vacancies), line defects such as slip lines (dislocations), and planar defects (stacking faults). Slip lines and stacking faults are dislocations caused by a local shift of atomic planes within the wafer's lattice structure and can propagate through the wafer for significant distances. Usually slip lines start at an edge of the wafer and begin with a shift of the outermost atomic planes at the edge of the wafer. Slip lines and stacking faults can permanently degrade the electrical and physical characteristics of a wafer and can cause significant leakage currents within devices that are formed on the wafer.

A frequent cause of slip lines and stacking faults are temperature gradients that occur between the center and edge of a wafer when a CVD process is used to form the epitaxial layer. The temperature gradients cause thermal stress within the wafer that is relaxed by formation of dislocations such as slip lines. The majority of slip lines start to be formed within the edge regions of the wafer. A frequent source or starting point for slip line formation are localized defects or mechanical stress that is prevalent in these regions. FIG. 1 illustrates a top plan view of a wafer surface scan result at 100. The wafer has a surface crystallographic plane orientation of {100} with a flat or notch at a bottom edge of the wafer. The surface scan was completed after an epitaxial layer was formed over the wafer. The wafer surface scan result reveals slip line defects 104 that lie along a [011] direction and begin at edge 102 of the wafer. Slip line defects 104 continue in direction 106 until termination. Slip line defects 108 lie along a [001] direction and begin at edge 102 of the wafer. Slip line defects 108 continue in direction 110 until termination. Also, at two other areas having 90° azimuthal angles, slip will occur because of the vertical matching of {111} planes at the wafer edge.

One approach that has been used to limit the formation of slip lines in wafers during a CVD process is to minimize wafer temperature gradients through the use of process controls and process equipment selection. However, due to large temperature gradients and enhanced mechanical stress that occurs within the 300 millimeter (12 inch) wafers that are now being used to manufacture devices such as IGBTs, minimizing slip line formation to acceptable levels is becoming increasingly difficult to achieve.

SUMMARY

According to an embodiment of a method, the method includes forming one or more barrier structures within a peripheral edge region of a substrate, and forming an epitaxial layer over the substrate.

According to an embodiment of a method for reducing defects during epitaxial deposition, the method includes providing a crystalline wafer substrate, forming one or more barrier structures within a peripheral edge region of the wafer substrate, and depositing an epitaxial layer over a surface of the wafer substrate. Each one of the one or more barrier structures includes at least one sidewall that is nonparallel to a surface of the wafer substrate.

According to an embodiment of a wafer, the wafer includes one or more barrier structures within a peripheral edge region of a substrate, and an epitaxial layer that overlies the substrate.

Those skilled in the art will recognize additional features and advantages upon reading the following detailed description, and upon viewing the accompanying drawings.

BRIEF DESCRIPTION OF THE DRAWINGS

The accompanying drawings are included to provide a further understanding of embodiments and are incorporated in and constitute a part of this specification. The drawings illustrate embodiments and together with the description serve to explain principles of embodiments. Other embodiments and many of the intended advantages of embodiments will be readily appreciated as they become better understood by reference to the following detailed description. The elements of the drawings are not necessarily to scale relative to each other. Like reference numerals designate corresponding similar parts.

FIG. 5A illustrates a cross-sectional view of an embodiment of a method of forming a barrier structure within a peripheral edge region of a wafer substrate.

FIG. 5B illustrates a cross-sectional view of an embodiment of a method of forming a barrier structure within a peripheral edge region of a wafer substrate.

FIG. 5C illustrates a cross-sectional view of an embodiment of a method of forming a barrier structure within a peripheral edge region of a wafer substrate.

FIG. 6A illustrates a cross-sectional view of an embodiment of a method of forming a barrier structure within a peripheral edge region of a wafer substrate.

FIG. 6B illustrates a cross-sectional view of an embodiment of a method of forming a barrier structure within a peripheral edge region of a wafer substrate.

FIG. 6C illustrates a cross-sectional view of an embodiment of a method of forming a barrier structure within a peripheral edge region of a wafer substrate.

FIG. 8A illustrates a cross-sectional view of an embodiment of a method of forming a barrier structure within a peripheral edge region of a wafer substrate.

FIG. 8B illustrates a cross-sectional view of an embodiment of a method of forming a barrier structure within a peripheral edge region of a wafer substrate.

FIG. 8C illustrates a cross-sectional view of an embodiment of a method of forming a barrier structure within a peripheral edge region of a wafer substrate.

FIG. 9A illustrates a cross-sectional view of an embodiment of a method of forming a barrier structure within a peripheral edge region of a wafer substrate.

FIG. 9B illustrates a cross-sectional view of an embodiment of a method of forming a barrier structure within a peripheral edge region of a wafer substrate.

FIG. 9C illustrates a cross-sectional view of an embodiment of a method of forming a barrier structure within a peripheral edge region of a wafer substrate.

DETAILED DESCRIPTION

In the following Detailed Description, reference is made to the accompanying drawings, which form a part hereof, and in which is shown by way of illustration specific embodiments in which the invention may be practiced. In this regard, directional terminology, such as "top," "bottom," "front," "back," "leading," "trailing," etc., is used with reference to the orientation of the Figure(s) being described. Because components of embodiments can be positioned in a number of different orientations, the directional terminology is used for purposes of illustration and is in no way limiting. It is to be understood that other embodiments may be utilized and structural or logical changes may be made without departing from the scope of the present invention. The following detailed description, therefore, is not to be taken in a limiting sense, and the scope of the present invention is defined by the appended claims. It is to be understood that the features of the various exemplary embodiments described herein may be combined with each other, unless specifically noted otherwise.

Figure 1:
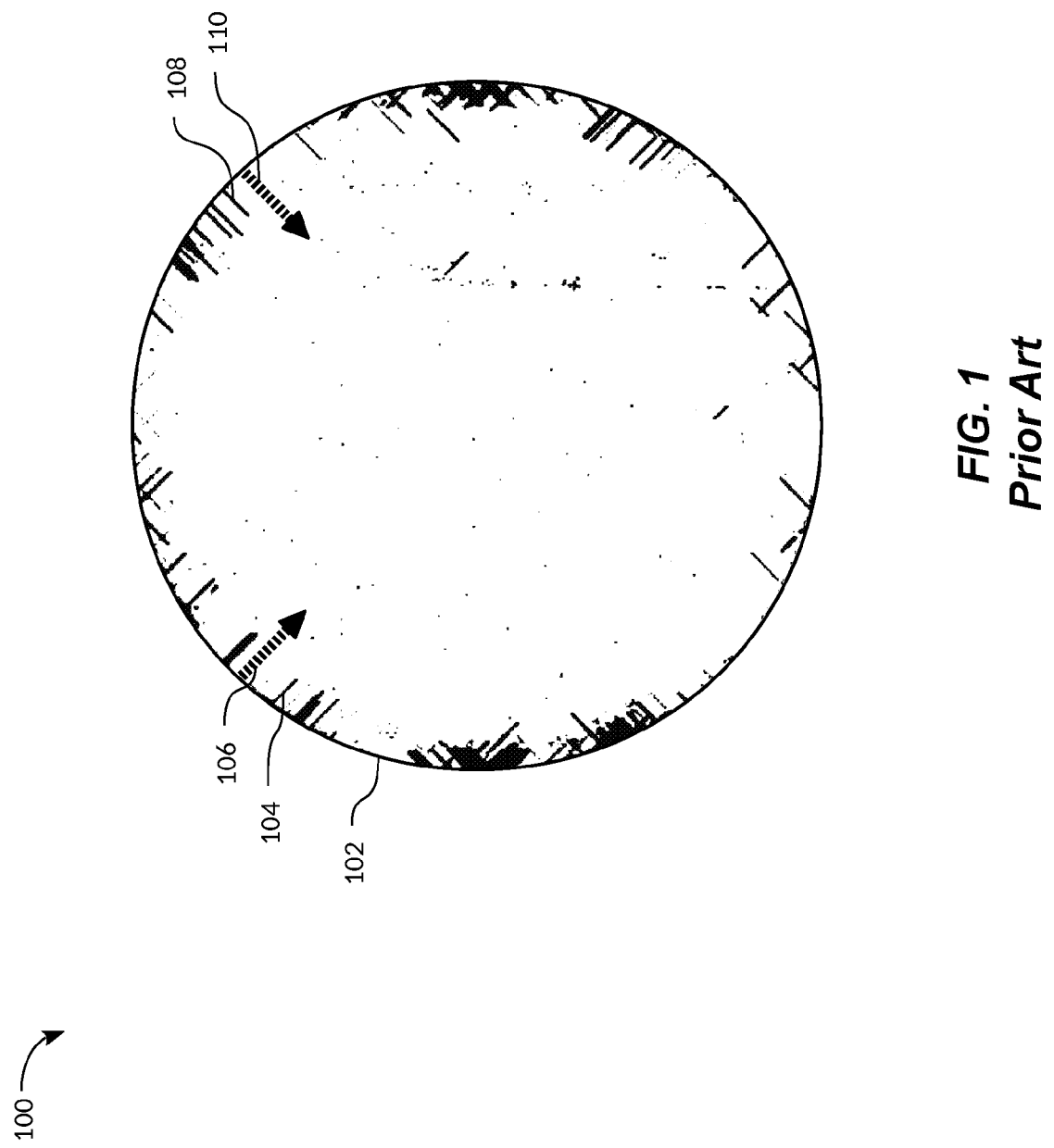
FIG. 1 illustrates a top plan view of a conventional wafer surface scan result after an epitaxial layer has been formed over the wafer.
Figure 2:
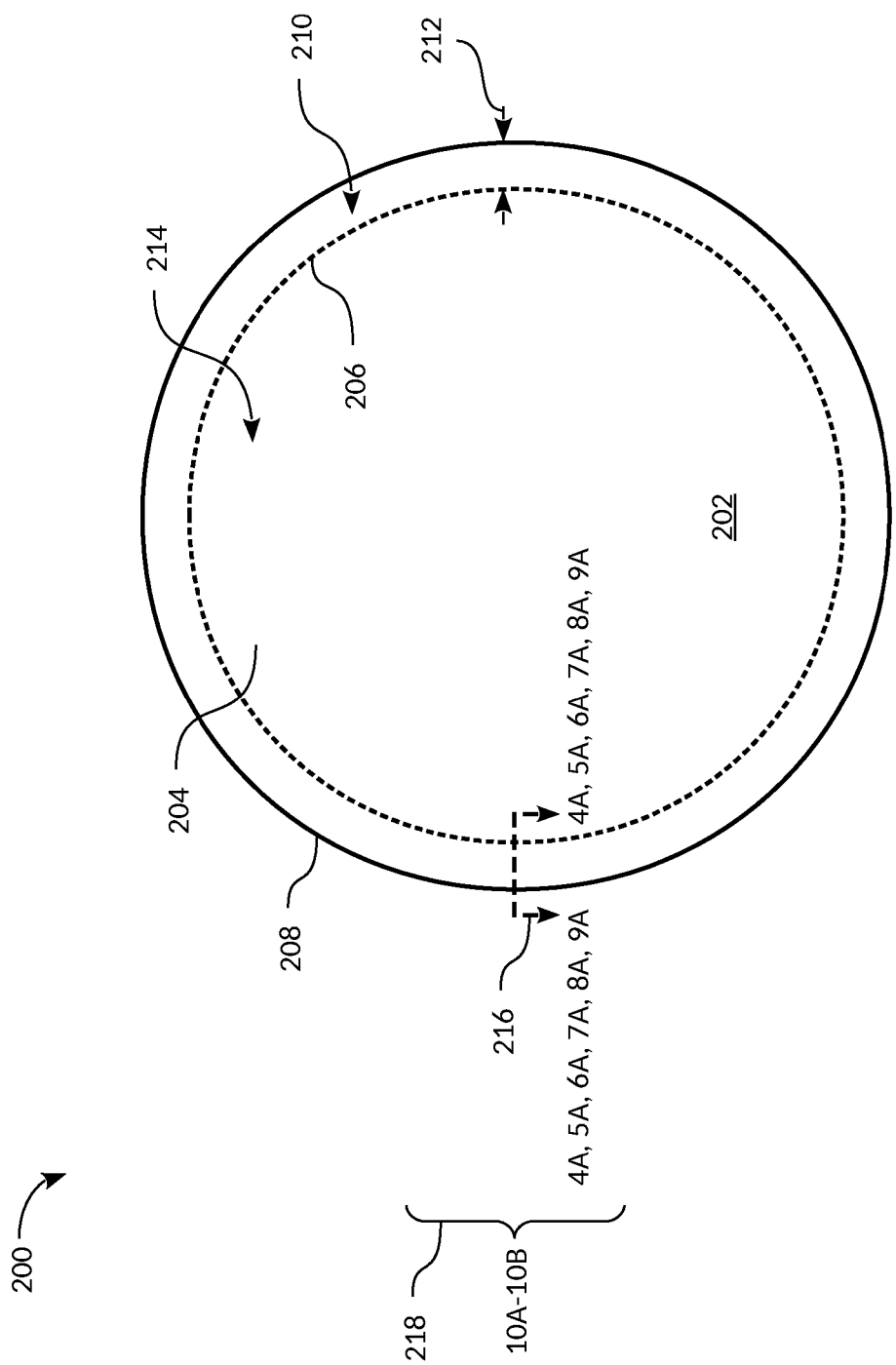
FIG. 2 illustrates a top plan view of an embodiment of a wafer substrate.

FIG. 2 illustrates a top plan view of an embodiment of a wafer at 200 that includes a substrate 202. In the illustrated embodiment, substrate 202 of wafer 200 is a silicon (Si) substrate. In other embodiments, substrate 202 can be formed from other suitable materials that include, but are not limited to, Silicon Carbide (SiC), Silicon Germanium (SiGe), Silicon on Insulator (SOI), Gallium Arsenide (GaAs) and Gallium Nitride (GaN).

Figure 10B:
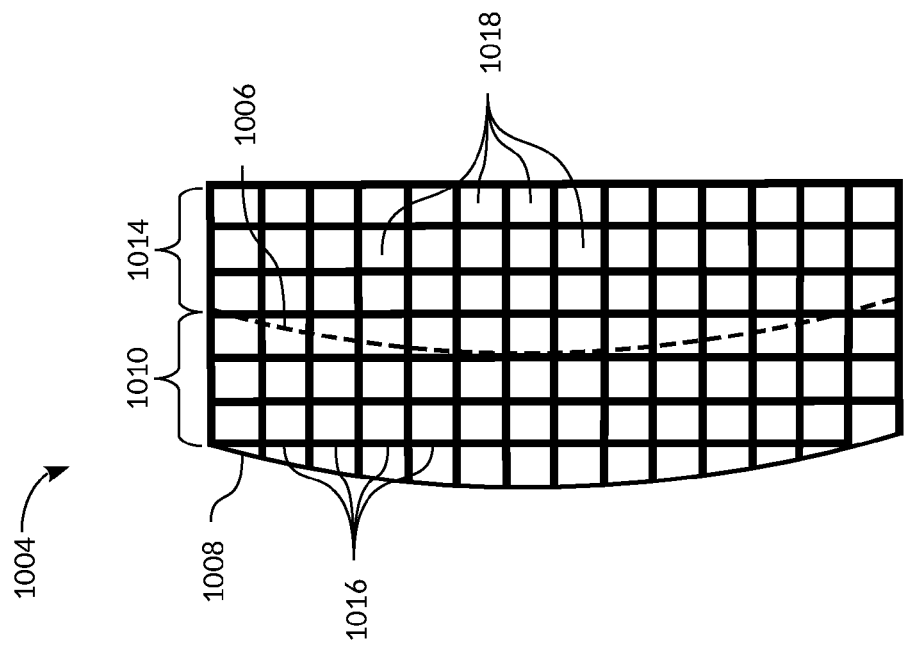
FIG. 10B illustrates a top plan view of an embodiment of barrier structures formed using a reticle on a wafer substrate.
Figure 10A:
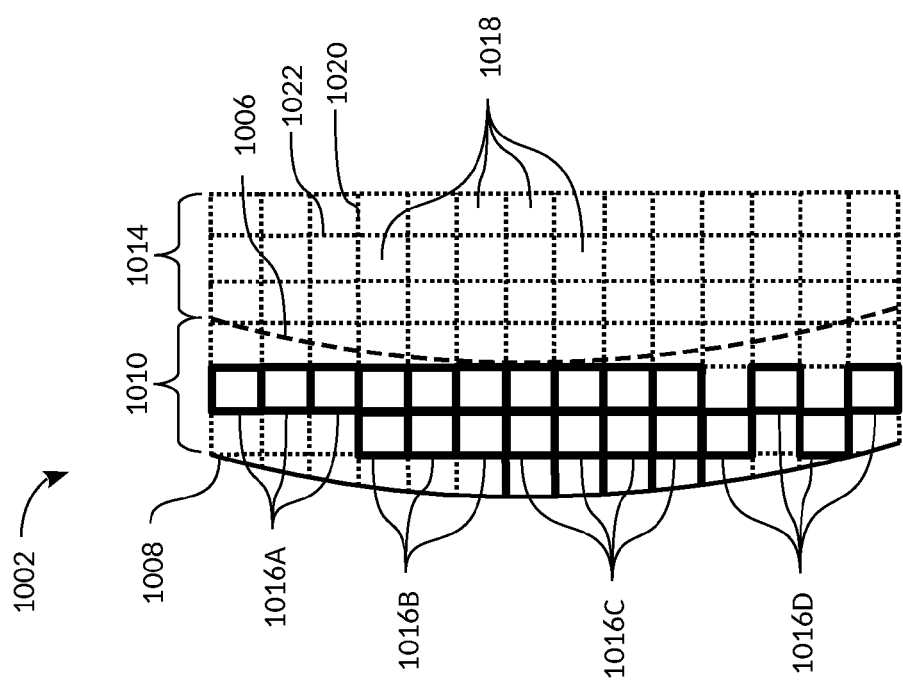
FIG. 10A illustrates a top plan view of an embodiment of barrier structures formed using a reticle on a wafer substrate.

In the illustrated embodiment, a surface of substrate 202 is illustrated at 204. This illustration of wafer 200 does not include an epitaxial layer over surface 204 (refer to FIGS. 4-9 for embodiments illustrating formation of an epitaxial layer over surface 204 of substrate 202). In the illustrated embodiment, edge 208 is a circumferential edge 208. In other embodiments, edge 208 can have other suitable shapes or dimensions. In the illustrated embodiment, a peripheral edge region 210 is defined between edge 208 and an interior boundary illustrated as a dashed line at 206. Interior region 214 is interior to boundary 206. Peripheral edge region 210 has a width as indicated at 212. In some embodiments, width 212 is equal to or greater than 100 microns and equal to or less than 7 millimeters. In some embodiments, width 212 is equal to or greater than 1 millimeter and equal to or less than 3 millimeters. In other embodiments, width 212 can have other suitable values or ranges. A cross-sectional view 216 for peripheral edge region 210 is illustrated in FIGS. 4A, 5A, 6A, 7A, 8A and 9A. The portion of wafer 202 used for the top plan views in FIGS. 10A-10B is illustrated at 218.

Figure 3:
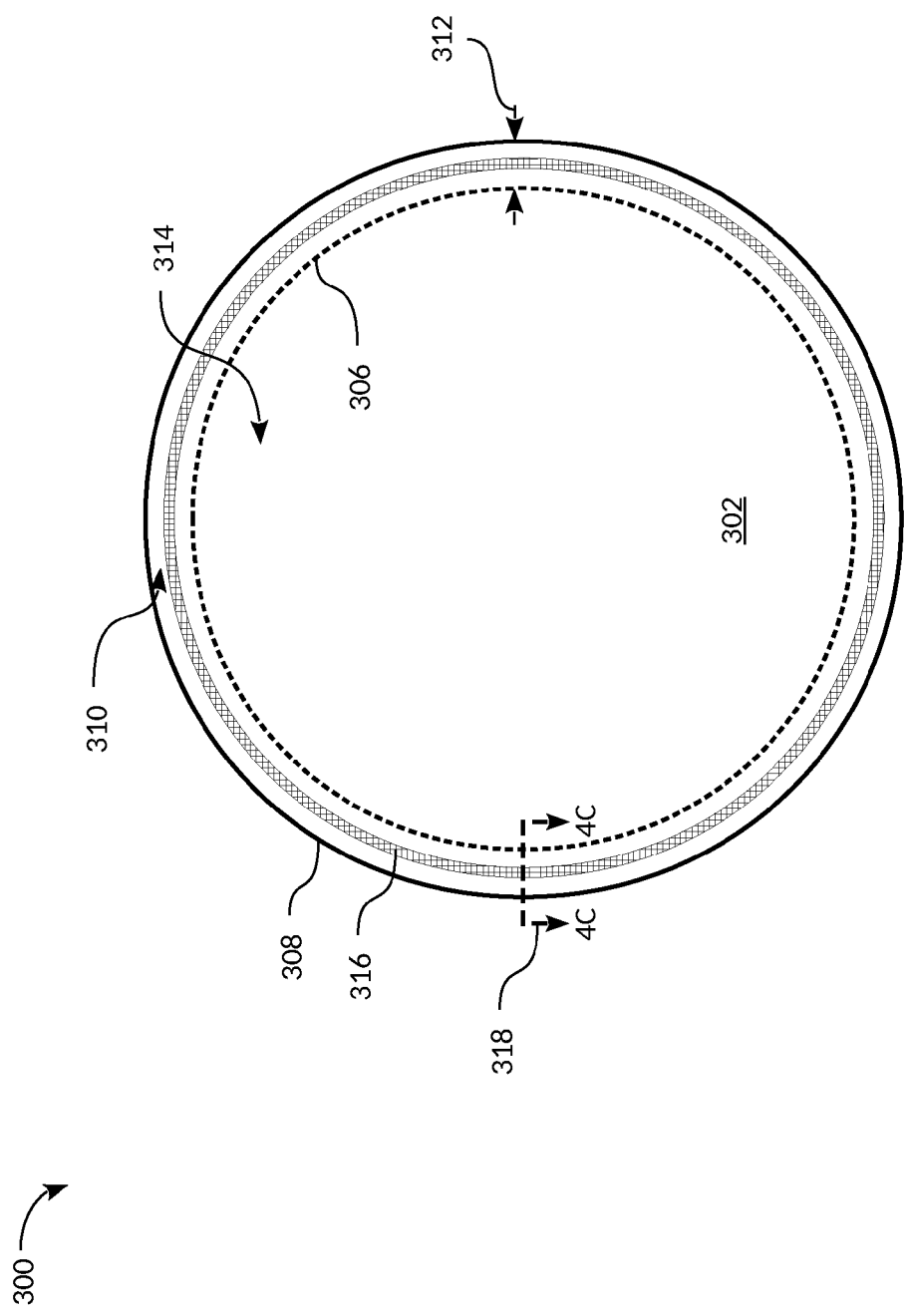
FIG. 3 illustrates a top plan view of an embodiment of a barrier structure within a peripheral edge region of a wafer substrate.
Figure 4B:
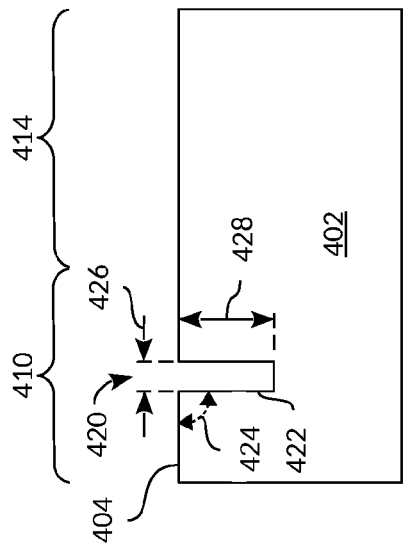
FIG. 4B illustrates a cross-sectional view of an embodiment of a method of forming a barrier structure within a peripheral edge region of a wafer substrate.
Figure 4D:
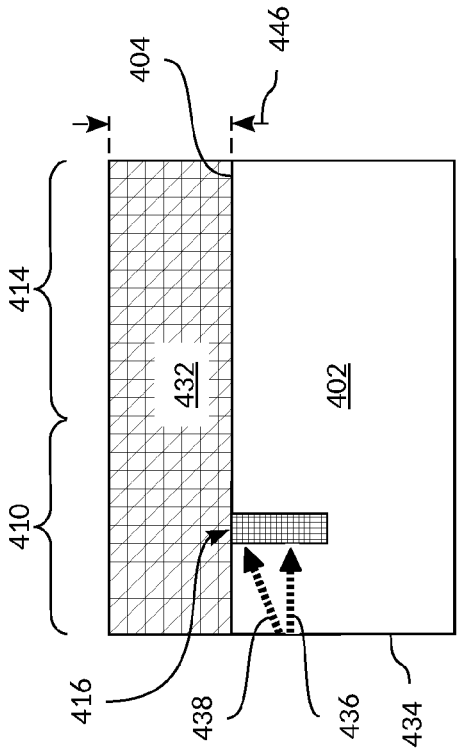
FIG. 4D illustrates a cross-sectional view of an embodiment of a method of forming a barrier structure within a peripheral edge region of a wafer substrate.

FIG. 3 illustrates a top plan view of an embodiment of a wafer 300 that includes a barrier structure 316 that is formed within peripheral edge region 310 of substrate 302. In other embodiments, one or more barrier structures 316 can be formed within interior region 314. In the illustrated embodiment, substrate 302 of wafer 300 is a Si substrate. In other embodiments, substrate 302 can be formed from other suitable materials that include, but are not limited to, SiC, SiGe, SOI, GaAs and GaN. Peripheral edge region 310 is between edge 308 of substrate 302 and interior boundary 306. A width of peripheral edge region 310 is illustrated at 312. In some embodiments, width 312 is equal to or greater than 100 microns and equal to or less than 7 millimeters. In some embodiments, width 312 is equal to or greater than 1 millimeter and equal to or less than 3 millimeters. In other embodiments, width 312 can have other suitable values or ranges. A cross-sectional view 318 for peripheral edge region 310 is illustrated in FIG. 4C.

In the illustrated embodiment, barrier structure 316 is continuous and is concentric with circumferential edge 308 of substrate 302. In other embodiments, barrier structure 316 is not continuous and includes two or more circumferential barrier structure sections 316 (not illustrated). In other embodiments, two or more barrier structures 316 are within peripheral edge region 310. In one embodiment, two or more barrier structures 316 are within peripheral edge region 310 and are concentric with circumferential edge 308 of substrate 302. In other embodiments, barrier structure 316 is not concentric with circumferential edge 308 of substrate 302. In the illustrated embodiment, barrier structure 316 provides a termination point for dislocations such as slip lines that begin at or near edge 308 of substrate 302. Barrier structure 316 prevents these dislocations from continuing into interior region 314 of wafer 300.

FIGS. 4A-4D illustrate cross-sectional views of an embodiment of a method of forming a barrier structure 416 within a peripheral edge region 410 of a wafer substrate 402. The method is illustrated at 400. In other embodiments, two or more barrier structures 416 can be formed within peripheral edge region 410. In other embodiments, one or more barrier structures 416 can be formed within interior region 414 of substrate 402.

Figure 4A:
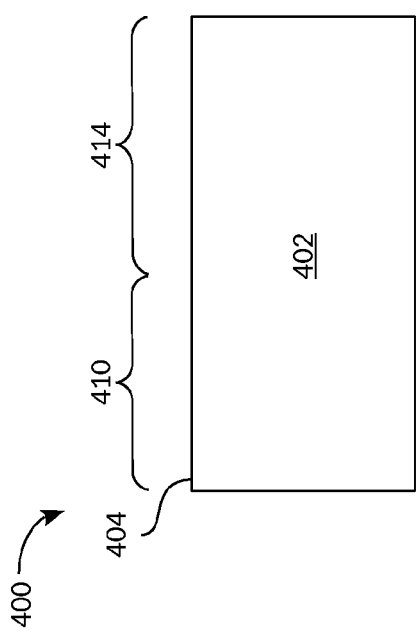
FIG. 4A illustrates a cross-sectional view of an embodiment of a method of forming a barrier structure within a peripheral edge region of a wafer substrate.
Figure 4C:
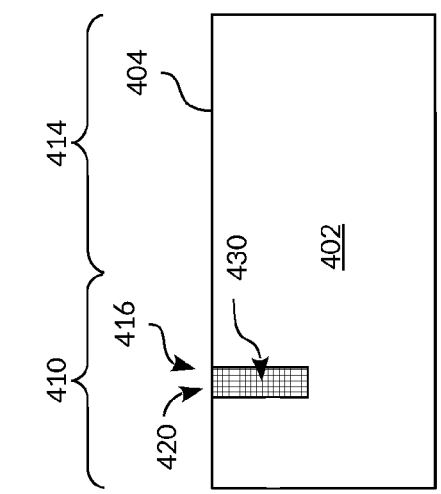
FIG. 4C illustrates a cross-sectional view of an embodiment of a method of forming a barrier structure within a peripheral edge region of a wafer substrate.

FIG. 4A illustrates a cross-sectional view of peripheral edge region 210 (see also, FIG. 2). In the illustrated embodiment, substrate 402 is a crystalline Si substrate. In other embodiments, substrate 402 can be formed from other suitable materials that include, but are not limited to, SiC, SiGe, SOI, GaAs and GaN.

FIG. 4B illustrates a cross-sectional view of an embodiment of a trench 420 that is formed within peripheral edge region 410 of wafer substrate 402. In other embodiments, two or more trenches 420 can be formed within peripheral edge region 410. In other embodiments, one or more trenches 420 can be formed within interior region 414 of substrate 402. In the illustrated embodiment, trench 420 includes at least one sidewall 422 that is nonparallel to surface 404 of substrate 402. Angle 424 illustrates an angle between surface 404 and sidewall 422 that is about 90 degrees. In other embodiments, angle 424 can have other suitable values. In the illustrated embodiment, trench 420 has a width 426 and a depth 428. In some embodiments, depth 428 has a value that is within a range of 10 microns to 80 microns. In some embodiments, depth 428 has a value that is greater than 80 microns. In some embodiments, depth 428 has a value that is less than 10 microns. In some embodiments, width 626 has a value that is equal to or less than 10 microns. In some embodiments, width 626 has a value that is greater than 10 microns. In other embodiments, trench 420 has a width 426 that is less then depth 428. In other embodiments, trench 420 has a width 426 that is equal to or greater than depth 428. In the illustrated embodiment, trench 420 has a rectangular shaped structure. In other embodiments, trench 420 can have other suitable shapes.

In the illustrated embodiment, trench 420 can be formed by using any suitable process. In one embodiment, trench 420 is formed by coating surface 404 with a masking resist, patterning the resist with a focused laser beam, and then etching trench 420 in substrate 402. In one embodiment, trench 420 can be formed by using a laser process that utilizes a focused laser beam to directly etch trench 420. In other embodiments, other suitable processes can be used to form trench 420.

FIG. 4C illustrates a cross-sectional view of an embodiment of a trench 420 after being filled with a filler material 430 to form barrier structure 416. In various embodiments, suitable filler materials 420 include, but are not limited to, silicon nitride ($Si_3N_4$), silicon carbide (SiC), silicon oxynitride (SiON), silicon dioxide ($SiO_2$), tantalum pentoxide ($Ta_2O_5$), zirconium dioxide ($ZrO_2$), aluminum oxide ($Al_2O_3$), polysilicon, amorphous silicon, semi-insulating polysilicon or amorphous carbon. In other embodiments, other suitable materials can be used.

In various embodiments, filler material 430 is a material that has a thermal conductivity that is greater than a thermal conductivity of substrate 402. In various embodiments, filler material 430 is a material that has a higher thermal conductivity than Si. In some embodiments, this helps to reduce stress caused by local thermal gradients that occur, for example, during the temperature ramp phases of an annealing process and in areas where wafer substrate 402 is in contact with a wafer boat or wafer holder. In these embodiments, filler material 430 functions as a heat conducting channel that improves lateral heat transfer within wafer substrate 402 and reduces or eliminates extreme local temperature peaks. Any suitable process can be used to fill trench 420 with filler material 430.

In some embodiments, barrier structure 416 is formed by using a focused laser beam on surface 404 of wafer substrate 402 where barrier structure 416 is to be formed. Using the focused laser beam locally transforms the single crystalline structure of wafer substrate 402 into a polycrystalline material that forms barrier structure 416. In these embodiments, trench 420 (see FIG. 4B) is not required as barrier structure 416 is formed on surface 404 of wafer substrate 402.

FIG. 4D illustrates a cross-sectional view of an embodiment of forming an epitaxial layer 432 over surface 404 of substrate 402. In the illustrated embodiment, epitaxial layer 432 is a Si epitaxial layer 432. In other embodiments, other suitable materials can be deposited epitaxially on surface 404 of substrate 402. These materials include, but are not limited to, Ge, GaN and SiC. In one embodiment, epitaxial layer 432 is formed from a same material as substrate 402. In other embodiments, epitaxial layer 432 is formed from a different material than the material used for substrate 402. In one embodiment, epitaxial layer 432 is formed by deposition by using a Chemical Vapor Deposition (CVD) process. In other embodiments, epitaxial layer 432 can be formed by other suitable processes that include, but are not limited to, Molecular Beam Epitaxy (MBE), Liquid Phase Epitaxy (LPE) and solid phase regrowth. In some embodiments, epitaxial layer 432 has a thickness 446 that is equal to or greater than 5 microns and equal to or less than 200 microns. In some embodiments, epitaxial layer 432 has a thickness 446 that is equal to or greater than 10 microns and equal to or less than 190 microns. In other embodiments, epitaxial layer 432 can have other suitable thicknesses 446 or ranges of thicknesses 446.

In the illustrated embodiment, epitaxial layer 432 is formed over barrier structure 416 and surface 404 of substrate 402. Barrier structure 416 provides a local barrier or termination point for slip line defects. In one embodiment, slip line defects that begin at edge 434 within peripheral edge region 410 and propagate in directions 436 and 438 are terminated by barrier structure 416. The slip line defects are prevented from continuing past barrier structure 416 into the portions of epitaxial layer 432 and/or substrate 402 that are within interior region 414. In other embodiments, barrier structure 416 provides a termination point for other types of structural imperfections that originate within peripheral edge region 410 and continue in directions 436 and 438. These types of structural imperfections include, but are not limited to, slip lines and planar defects (stacking faults).

FIGS. 5A-5C illustrate cross-sectional views of an embodiment of a method of forming a barrier structure 516 within a peripheral edge region 510 of a wafer substrate 502. The method is illustrated at 500. In other embodiments, two or more barrier structures 516 can be formed within peripheral edge region 510. In other embodiments, one or more barrier structures 516 can be formed within interior region 514 of substrate 502.

FIG. 5A illustrates a cross-sectional view of peripheral edge region 210 (see also, FIG. 2). In the illustrated embodiment, substrate 502 is a crystalline Si substrate. In other embodiments, substrate 502 can be formed from other suitable materials that include, but are not limited to, SiC, SiGe, SOI, GaAs and GaN.

FIG. 5B illustrates a cross-sectional view of an embodiment of a trench 520 that forms a barrier structure 516. Barrier structure 516 is formed within peripheral edge region 510 of wafer substrate 502. In other embodiments, two or more trenches 520 can be formed within peripheral edge region 510. In other embodiments, one or more trenches 520 can be formed within interior region 514 of substrate 502. In the illustrated embodiment, trench 520 includes at least one sidewall 522 that is nonparallel to surface 504 of substrate 502. Angle 524 illustrates an angle between surface 504 and sidewall 522 that is about 90 degrees. In other embodiments, angle 524 can have other suitable values. In the illustrated embodiment, trench 520 has a width 526 and a depth 528. In some embodiments, depth 528 has a value that is within a range of 10 microns to 80 microns. In some embodiments, depth 528 has a value that is greater than 80 microns. In some embodiments, depth 528 has a value that is less than 10 microns. In some embodiments, width 526 has a value that is equal to or less than 10 microns. In some embodiments, width 526 has a value that is greater than 10 microns. In other embodiments, trench 520 has a suitable width 526 that is less then depth 528. In other embodiments, trench 520 has a suitable width 526 that is equal to or greater than depth 528. In the illustrated embodiment, trench 520 has a rectangular shaped structure. In other embodiments, trench 520 can have other suitable shapes.

In the illustrated embodiment, trench 520 can be formed by using any suitable process. In one embodiment, trench 520 is formed by coating surface 504 with a masking resist, patterning the resist with a focused laser beam, and then etching trench 520 in substrate 502. In one embodiment, trench 520 can be formed by using a laser process that utilizes a focused laser beam to directly etch trench 520. In other embodiments, other suitable processes can be used to form trench 520.

FIG. 5C illustrates a cross-sectional view of an embodiment of forming an epitaxial layer 532 over surface 504 of substrate 502. In some embodiments, epitaxial layer 532 has a thickness 546 that is equal to or greater than 5 microns and equal to or less than 200 microns. In some embodiments, epitaxial layer 532 has a thickness 546 that is equal to or greater than 10 microns and equal to or less than 190 microns. In other embodiments, epitaxial layer 532 can have other suitable thicknesses 546 or ranges of thicknesses 546.

In the embodiment illustrated in FIG. 5C, epitaxial layer 532 is formed over trench 520 and does not fill trench 520. In one embodiment, a selective Epitaxial Lateral Overgrowth (ELO) process can be used to form epitaxial layer 532 over trench 520. In this embodiment, trench 520 will extend into epitaxial layer 532 during growth of epitaxial layer 532 before the ELO process can completely overgrow trench 520 (see dash line at 540). The distance of trench extension 540 into epitaxial layer 532 as measured from surface 504 is illustrated at 542. In various embodiments, distance 542 be adjusted by using suitable parameters for growing epitaxial layer 532. Trench extension 540 prevents crystal defects that start at edge 544 of epitaxial layer 532 from penetrating beyond trench extension 540 and into interior region 514 during the ELO process. In various embodiments, for larger values of depth 528 and width 526, the ELO process can be used to smooth the surface topology of epitaxial layer 532. In the illustrated embodiment, epitaxial layer 532 is a Si epitaxial layer 532. In other embodiments, other suitable materials can be deposited epitaxially on surface 504 of substrate 502. These materials include, but are not limited to, Ge, GaN and SiC. In one embodiment, epitaxial layer 532 is formed from a same material as substrate 502. In other embodiments, epitaxial layer 532 is formed from a different material than the material used for substrate 502. In one embodiment, epitaxial layer 532 is formed by deposition by using a CVD process. In other embodiments, epitaxial layer 532 can be formed by using other suitable processes that include, but are not limited to, MBE, LPE and solid phase regrowth.

In the illustrated embodiment, epitaxial layer 532 is formed over barrier structure 516 and surface 504 of substrate 502. Barrier structure 516 provides a local barrier or termination point for slip line defects. In one embodiment, slip line defects that begin at edge 534 within peripheral edge region 510 and propagate in directions 536 and 538 are terminated by barrier structure 516. The slip line defects are prevented from continuing past barrier structure 516 into the portions of epitaxial layer 532 and/or substrate 502 that are within interior region 514. In other embodiments, barrier structure 516 provides a termination point for other types of structural imperfections that originate within peripheral edge region 510 and continue in directions 536 and 538. These types of structural imperfections include, but are not limited to, slip lines and planar defects (stacking faults).

FIGS. 6A-6C illustrate cross-sectional views of an embodiment of a method of forming a barrier structure 616 within a peripheral edge region 610 of a wafer substrate 602. The method is illustrated at 600. In other embodiments, two or more barrier structures 616 can be formed within peripheral edge region 610. In other embodiments, one or more barrier structures 616 can be formed within interior region 614 of substrate 602.

FIG. 6A illustrates a cross-sectional view of peripheral edge region 210 (see also, FIG. 2). In the illustrated embodiment, substrate 602 is a crystalline Si substrate. In other embodiments, substrate 602 can be formed from other suitable materials that include, but are not limited to, SiC, SiGe, SOI, GaAs and GaN.

FIG. 6B illustrates a cross-sectional view of an embodiment of a trench 620 that forms a barrier structure 616. Barrier structure 616 is formed within peripheral edge region 610 of wafer substrate 602. In other embodiments, two or more trenches 620 can be formed within peripheral edge region 610. In other embodiments, one or more trenches 620 can be formed within interior region 614 of substrate 602. In the illustrated embodiment, trench 620 includes at least one sidewall 622 that is nonparallel to surface 604 of substrate 602. Angle 624 illustrates an angle between surface 604 and sidewall 622 that is about 90 degrees. In other embodiments, angle 624 can have other suitable values. In the illustrated embodiment, trench 620 has a width 626 and a depth 628. In some embodiments, depth 628 has a value that is within a range of 10 microns to 80 microns. In some embodiments, depth 628 has a value that is greater than 80 microns. In some embodiments, depth 628 has a value that is less than 10 microns. In some embodiments, width 626 has a value that is equal to or less than 10 microns. In some embodiments, width 626 has a value that is greater than 10 microns. In other embodiments, trench 620 has a width 626 that is less then depth 628. In other embodiments, trench 620 has a width 626 that is equal to or greater than depth 628. In the illustrated embodiment, trench 620 has a rectangular shaped structure. In other embodiments, trench 620 can have other suitable shapes.

In the illustrated embodiment, trench 620 can be formed by using any suitable process. In one embodiment, trench 620 is formed by coating surface 604 with a masking resist, patterning the resist with a focused laser beam, and then etching trench 620 in substrate 602. In one embodiment, trench 620 can be formed by using a laser process that utilizes a focused laser beam to directly etch trench 620. In other embodiments, other suitable processes can be used to form trench 620.

FIG. 6C illustrates a cross-sectional view of an embodiment of forming an epitaxial layer 632 over surface 604 of substrate 602. In some embodiments, epitaxial layer 632 has a thickness 646 that is equal to or greater than 5 microns and equal to or less than 200 microns. In some embodiments, epitaxial layer 632 has a thickness 646 that is equal to or greater than 10 microns and equal to or less than 190 microns. In other embodiments, epitaxial layer 632 can have other suitable thicknesses 646 or ranges of thicknesses 646.

In the embodiment illustrated in FIG. 6C, epitaxial layer 632 is formed over trench 620 and within trench 620. In one embodiment, trench 620 is completely filled by epitaxial layer 632. In one embodiment, trench 620 is partially filled by epitaxial layer 632. In other embodiments, at least a portion of trench 620 is filled by epitaxial layer 632.

In the illustrated embodiment, epitaxial layer 632 is a Si epitaxial layer 632. In other embodiments, other suitable materials can be deposited epitaxially on surface 604 of substrate 602. These materials include, but are not limited to, Ge, GaN and SiC. In one embodiment, epitaxial layer 632 is formed from a same material as substrate 602. In other embodiments, epitaxial layer 632 is formed from a different material than the material used for substrate 602. In one embodiment, epitaxial layer 632 is formed by deposition by using a CVD process. In other embodiments, epitaxial layer 632 can be formed by other suitable processes that include, but are not limited to, MBE, LPE and solid phase regrowth.

In the illustrated embodiment, epitaxial layer 632 is formed over barrier structure 616 and surface 604 of substrate 602. Barrier structure 616 provides a local barrier or termination point for slip line defects. In one embodiment, slip line defects that begin at edge 634 within peripheral edge region 610 and propagate in directions 636 and 638 are terminated by barrier structure 616. The slip line defects are prevented from continuing past barrier structure 616 into the portions of epitaxial layer 632 and/or substrate 602 that are within interior region 614. In other embodiments, barrier structure 616 provides a termination point for other types of structural imperfections that originate within peripheral edge region 610 and continue in directions 636 and 638. These types of structural imperfections include, but are not limited to, slip lines and planar defects (stacking faults).

Figure 7B:
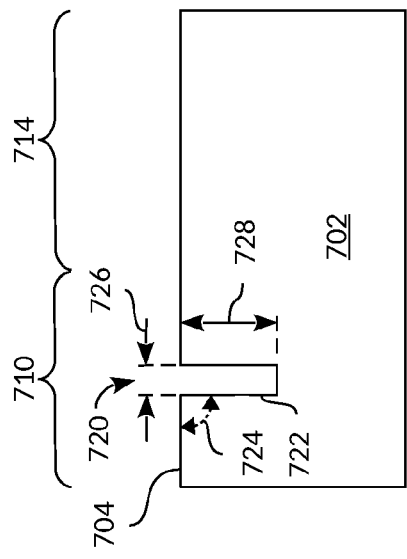
FIG. 7B illustrates a cross-sectional view of an embodiment of a method of forming a barrier structure within a peripheral edge region of a wafer substrate.
Figure 7D:
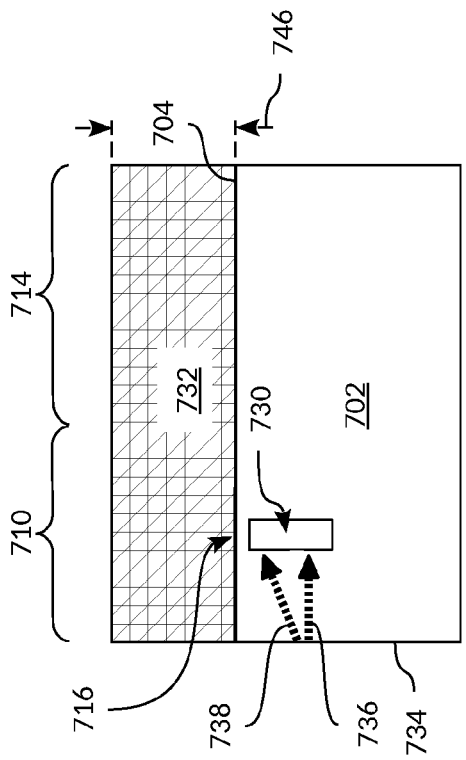
FIG. 7D illustrates a cross-sectional view of an embodiment of a method of forming a barrier structure within a peripheral edge region of a wafer substrate.
Figure 7A:
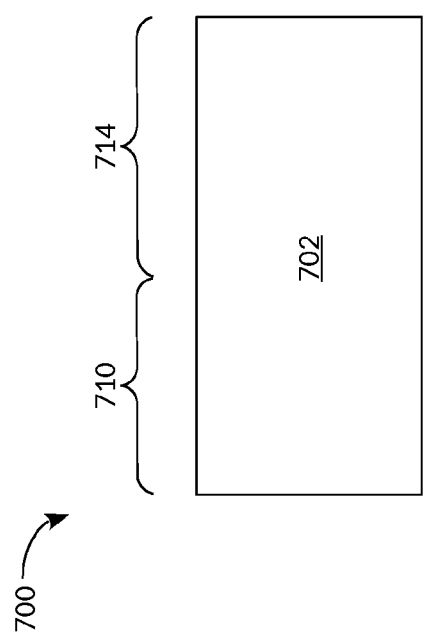
FIG. 7A illustrates a cross-sectional view of an embodiment of a method of forming a barrier structure within a peripheral edge region of a wafer substrate.
Figure 7C:
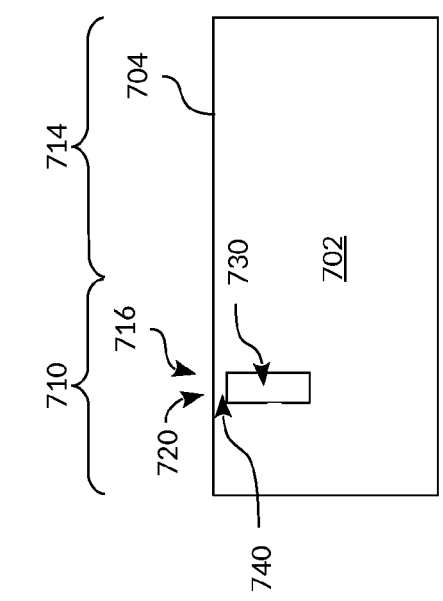
FIG. 7C illustrates a cross-sectional view of an embodiment of a method of forming a barrier structure within a peripheral edge region of a wafer substrate.

FIGS. 7A-7C illustrate cross-sectional views of an embodiment of a method of forming a barrier structure 716 within a peripheral edge region 710 of a wafer substrate 702. The method is illustrated at 700. In other embodiments, two or more barrier structures 716 can be formed within peripheral edge region 710. In other embodiments, one or more barrier structures 716 can be formed within interior region 714 of substrate 702.

FIG. 7A illustrates a cross-sectional view of peripheral edge region 210 (see also, FIG. 2). In the illustrated embodiment, substrate 702 is a crystalline Si substrate. In other embodiments, substrate 702 can be formed from other suitable materials that include, but are not limited to, SiC, SiGe, SOI, GaAs and GaN.

FIG. 7B illustrates a cross-sectional view of an embodiment of a trench 720 that is formed within a within peripheral edge region 710 of wafer substrate 702. In other embodiments, two or more trenches 720 can be formed within peripheral edge region 710. In other embodiments, one or more trenches 720 can be formed within interior region 714 of substrate 702. In the illustrated embodiment, trench 720 includes at least one sidewall 722 that is non-parallel to surface 704 of substrate 702. Angle 724 illustrates an angle between surface 704 and sidewall 722 that is about 90 degrees. In other embodiments, angle 724 can have other suitable values. In the illustrated embodiment, trench 720 has a width 726 and a depth 728. In one embodiment, depth 728 has a value of about 10 microns and width 726 has a value that is less than 10 microns. In other embodiments, trench 720 has a width 726 that is less then depth 728. In other embodiments, trench 720 has a width 726 that is equal to or greater than depth 728. In the illustrated embodiment, trench 720 has a rectangular shaped structure. In other embodiments, trench 720 can have other suitable shapes.

In the illustrated embodiment, trench 720 can be formed by using any suitable process. In one embodiment, trench 720 is formed by coating surface 704 with a masking resist, patterning the resist with a focused laser beam, and then etching trench 720 in substrate 702. In one embodiment, trench 720 can be formed by using a laser process that utilizes a focused laser beam to directly etch trench 720. In other embodiments, other suitable processes can be used to form trench 720.

FIG. 7C illustrates a cross-sectional view of an embodiment of a cavity 730 within substrate 702 that forms a barrier structure 716. In the illustrated embodiment, trench 720 is covered using a Venecia process to define cavity 730. In one embodiment, the Venecia process is performed by application of a high temperature annealing process in a hydrogen environment. This results in the formation of the upper cap layer 740 of the trench by the movement of silicon atoms, in particular in lateral directions, in the upper area of the trench. In the illustrated embodiment, the Venecia process is used to form cavity 730 within a crystalline Si substrate 702. In other embodiments, other suitable processes can be used to form cavity 730 within substrate 702.

In other embodiments, at least a portion of trench 720 is filled with a filler material before being covered using the Venecia process (see also, FIG. 4C). Suitable filler materials include, but are not limited to, $Si_3N_4$, SiC, SiON, $SiO_2$, $Ta_2O_5$, $ZrO_2$, $Al_2O_3$, polysilicon, amorphous silicon, semi-insulating polysilicon or amorphous carbon. In these embodiments, trench 720 is covered using the Venecia process to define a cavity 730 that is partially filled or completely filled with the filler material.

FIG. 7D illustrates a cross-sectional view of an embodiment of forming an epitaxial layer 732 over surface 704 of substrate 702. In some embodiments, epitaxial layer 732 has a thickness 746 that is equal to or greater than 5 microns and equal to or less than 200 microns. In some embodiments, epitaxial layer 732 has a thickness 746 that is equal to or greater than 10 microns and equal to or less than 190 microns. In other embodiments, epitaxial layer 732 can have other suitable thicknesses 746 or ranges of thicknesses 746.

In the illustrated embodiment, epitaxial layer 732 is a Si epitaxial layer 732. In other embodiments, other suitable materials can be deposited epitaxially on surface 704 of substrate 702. These materials include, but are not limited to, Ge, GaN and SiC. In one embodiment, epitaxial layer 732 is formed from a same material as substrate 702. In other embodiments, epitaxial layer 732 is formed from a different material than the material used for substrate 702. In one embodiment, epitaxial layer 732 is formed by deposition by using a CVD process. In other embodiments, epitaxial layer 732 can be formed by other suitable processes that include, but are not limited to, MBE, LPE and solid phase regrowth.

In the illustrated embodiment, epitaxial layer 732 is formed over surface 704 of substrate 702. Barrier structure 716 provides a local barrier or termination point for slip line defects. In one embodiment, slip line defects that begin at edge 734 within peripheral edge region 710 and propagate in directions 736 and 738 are terminated by barrier structure 716. The slip line defects are prevented from continuing past barrier structure 716 into the portions of epitaxial layer 732 and/or substrate 702 that are within interior region 714. In other embodiments, barrier structure 716 provides a termination point for other types of structural imperfections that originate within peripheral edge region 710 and continue in directions 736 and 738. These types of structural imperfections include, but are not limited to, slip lines and planar defects (stacking faults).

FIGS. 8A-8C illustrate cross-sectional views of an embodiment of a method of forming a barrier structure 816 within a peripheral edge region 810 of a wafer substrate 802. The method is illustrated at 800. In other embodiments, two or more barrier structures 816 can be formed within peripheral edge region 810. In other embodiments, one or more barrier structures 816 can be formed within interior region 814 of substrate 802.

FIG. 8A illustrates a cross-sectional view of peripheral edge region 210 (see also, FIG. 2). In the illustrated embodiment, substrate 802 is a crystalline Si substrate. In other embodiments, substrate 802 can be formed from other suitable materials that include, but are not limited to, SiC, SiGe, SOI, GaAs and GaN.

FIG. 8B illustrates a cross-sectional view of an embodiment of an oxide structure 840 that forms a barrier structure 816. In the illustrated embodiment, barrier structure 816 is formed over surface 804 of wafer substrate 802. Barrier structure 816 is formed within peripheral edge region 810 of wafer substrate 802. In other embodiments, two or more oxide structures 840 can be formed within peripheral edge region 810. In other embodiments, one or more oxide structures 840 can be formed within interior region 814 of substrate 802. In the illustrated embodiment, oxide structure 840 has a width 826 and a height 828. In the illustrated embodiment, oxide structure 840 has a width 826 that is greater than height 828. In other embodiments, oxide structure 840 has a width 826 that is equal to or less than height 828.

In the illustrated embodiment, oxide structure 840 can be formed using any suitable process. In the illustrated embodiment, oxide structure 840 is formed with $SiO_2$. In other embodiments, oxide structure 840 can be formed using other suitable materials that include, but are not limited to, SiON, $Ta_2O_5$, $Al_2O_3$, gallium oxide ($Ga_2O_3$), indium oxide ($In_2O_3$), tin oxide ($SnO_2$), titanium dioxide ($TiO_2$), amorphous carbon, graphite and diamond-like carbon.

In the illustrated embodiment, oxide structure 840 is formed to be adjacent to edge 834 of substrate 802. In other embodiments, oxide structure 840 is not adjacent to edge 834 of substrate 802. For example, in one embodiment, oxide structure 840 has a width 826 that is smaller in size than peripheral edge region 810 and is formed to be centered within peripheral edge region 810 (not illustrated).

FIG. 8C illustrates a cross-sectional view of an embodiment of forming an epitaxial layer 832 over surface 804 of substrate 802. In some embodiments, epitaxial layer 832 has a thickness 846 that is equal to or greater than 5 microns and equal to or less than 200 microns. In some embodiments, epitaxial layer 832 has a thickness 846 that is equal to or greater than 10 microns and equal to or less than 190 microns. In other embodiments, epitaxial layer 832 can have other suitable thicknesses 846 or ranges of thicknesses 846.

In the embodiment illustrated in FIG. 8C, epitaxial layer 832 is formed over oxide structure 820. This can be achieved by setting the process parameters of the epitaxial deposition such that lateral epitaxial overgrowth will occur. In the illustrated embodiment, epitaxial layer 832 is a Si epitaxial layer 832. In other embodiments, other suitable materials can be deposited epitaxially on surface 804 of substrate 802. These materials include, but are not limited to, Ge, GaN and SiC. In one embodiment, epitaxial layer 832 is formed from a same material as substrate 802. In other embodiments, epitaxial layer 832 is formed from a different material than the material used for substrate 802. In one embodiment, epitaxial layer 832 is formed by deposition by using a CVD process. In other embodiments, epitaxial layer 832 can be formed by other suitable processes that include, but are not limited to, MBE, LPE and solid phase regrowth.

In the illustrated embodiment, epitaxial layer 832 is formed over barrier structure 816 and surface 804 of substrate 802. Barrier structure 816 provides a local barrier or termination point for slip line defects that start in the part of surface 804 that is covered by oxide structure 840. In the illustrated embodiments, slip line defects that begin at edge 834 or below oxide structure 840 in the vicinity of surface 804 and propagate in direction 838 are terminated by barrier structure 816. The slip line defects are prevented from continuing past barrier structure 816 into epitaxial layer 832. These types of structural imperfections include, but are not limited to, slip lines and planar defects (stacking faults).

FIGS. 9A-9C illustrate cross-sectional views of an embodiment of a method of forming a barrier structure 916 within a peripheral edge region 910 of a wafer substrate 902. The method is illustrated at 900. In other embodiments, two or more barrier structures 916 can be formed within peripheral edge region 910. In other embodiments, one or more barrier structures 916 can be formed within interior region 914 of substrate 902.

FIG. 9A illustrates a cross-sectional view of peripheral edge region 210 (see also, FIG. 2). In the illustrated embodiment, substrate 902 is a crystalline Si substrate. In other embodiments, substrate 902 can be formed from other suitable materials that include, but are not limited to, SiC, SiGe, SOI, GaAs and GaN.

FIG. 9B illustrates a cross-sectional view of an embodiment of an oxide structure 940 that forms a barrier structure 916. In the illustrated embodiment, barrier structure 916 is formed over surface 904 of wafer substrate 902. Barrier structure 916 is formed within peripheral edge region 910 of wafer substrate 902. In other embodiments, two or more oxide structures 940 can be formed within peripheral edge region 910. In other embodiments, one or more oxide structures 940 can be formed within interior region 914 of substrate 902. In the illustrated embodiment, oxide structure 940 has a width 926 and a height 928. In the illustrated embodiment, oxide structure 940 has a width 926 that is greater than height 928. In other embodiments, oxide structure 940 has a width 926 that is equal to or less than height 928.

In the illustrated embodiment, oxide structure 940 can be formed using any suitable process. In the illustrated embodiment, oxide structure 940 is formed with $SiO_2$. In other embodiments, oxide structure 940 can be formed using other suitable materials that include, but are not limited to, SiON, $Ta_2O_5$, $Al_2O_3$, $Ga_2O_3$, $In_2O_3$, $SnO_2$, $TiO_2$, amorphous carbon, graphite and diamond-like carbon.

In the illustrated embodiment, oxide structure 940 is formed to be adjacent to edge 934 of substrate 902. In other embodiments, oxide structure 940 is not adjacent to edge 934 of substrate 902. For example, in one embodiment, oxide structure 940 has a width 926 that is smaller in size than peripheral edge region 910 and is formed to be centered within peripheral edge region 910 (not illustrated).

FIG. 9C illustrates a cross-sectional view of an embodiment of forming an epitaxial layer 932 over surface 904 of substrate 902. In some embodiments, epitaxial layer 932 has a thickness 946 that is equal to or greater than 5 microns and equal to or less than 200 microns. In some embodiments, epitaxial layer 932 has a thickness 946 that is equal to or greater than 10 microns and equal to or less than 190 microns. In other embodiments, epitaxial layer 932 can have other suitable thicknesses 946 or ranges of thicknesses 946.

In the embodiment illustrated in FIG. 9C, epitaxial layer 932 is formed over oxide structure 940. In the illustrated embodiment, epitaxial layer 932 is a Si epitaxial layer 932. In other embodiments, other suitable materials can be deposited epitaxially on surface 904 of substrate 902. These materials include, but are not limited to, Ge, GaN and SiC. In one embodiment, epitaxial layer 932 is formed from a same material as substrate 902. In other embodiments, epitaxial layer 932 is formed from a different material than the material used for substrate 902. In one embodiment, epitaxial layer 932 is formed by deposition by using a CVD process. In other embodiments, epitaxial layer 932 can be formed by other suitable processes that include, but are not limited to, MBE, LPE and solid phase regrowth.

In the illustrated embodiment, epitaxial layer 932 is formed over substrate 902. Formation or deposition over surface 904 will result in homoepitaxial deposition (e.g., Si on Si growth). Epitaxial layer 932 will have the same crystalline orientation as substrate 902. In one exemplary embodiment, Si substrate 902 and Si epitaxial layer 932 both have a {111} orientation. In the illustrated embodiment, formation or deposition over surface 944 of oxide structure 940 will result in the deposited atoms having no structure or crystalline orientation and will result in a polycrystalline layer 942 over surface 944 of oxide structure 940. In one exemplary embodiment, oxide structure 940 is $SiO_2$ and polycrystalline layer 942 is polysilicon.

In the illustrated embodiment, barrier structure 916 provides a local barrier or termination point for slip line defects. In the illustrated embodiments, slip line defects that begin at edge 934 and/or below oxide structure 940 and close to surface 904 and propagate in direction 938 are terminated by barrier structure 916. The slip line defects are prevented from continuing past barrier structure 916 into epitaxial layer 932. These types of structural imperfections include, but are not limited to, slip lines and planar defects (stacking faults).

FIGS. 10A-10B illustrate top plan views, respectively, of embodiments of barrier structures 1016 formed using a reticle on a wafer substrate 202. In these embodiments, a stepper uses a reticle to expose a single barrier structure 1016 at a time on the wafer. In the illustrated embodiments, a same reticle is used to form each barrier structure 1016. In other embodiments, barrier structures 1016 can be formed using reticles having different arrangements of barrier structures (e.g., see FIGS. 11A-11D). The barrier structures 1016 illustrated in FIGS. 10A-10B correspond to barrier structure 1116A illustrated in FIG. 11A. In other embodiments, barrier structures 1016 can be formed within horizontal lines 1020 and vertical lines 1022. In these embodiments, horizontal lines 1020 are horizontal kerf lines 1020 and vertical lines 1022 are vertical kerf lines 1022. In other embodiments, barrier structures 1016 can be formed using reticles having different sizes. In these embodiments, the spacing between horizontal lines 1020 and the spacing between vertical lines 1022 can be different within peripheral edge region 1010 and interior region 1014. For example, barrier structures 1016 within peripheral edge region 1010 can be larger in size or smaller in size than die that are formed within interior region 1014 (not illustrated).

In the illustrated embodiments, barrier structures 1016 are formed using the method illustrated in FIGS. 4A-4D (e.g., trench 420 is filled with a filler material 430 to form barrier structure 416). Each barrier structure 1016 is illustrated by a dark rectangular outline. In these embodiments, the barrier structures comprise a plurality of contiguous die that each include one or more trenches 420 (see also, FIG. 4). In other embodiments, the barrier structures comprise a plurality of die that are not contiguous. In other embodiments, barrier structures 1016 may be formed using other suitable methods that include, but are not limited to, the methods illustrated in FIGS. 5A-5C, FIGS. 6A-6C, FIGS. 7A-7D, FIGS. 8A-8C and FIGS. 9A-9C.

In the illustrated embodiments, the portion of wafer 202 used for the top plan views in FIGS. 10A-10B is illustrated in FIG. 2 at 218. FIG. 10A illustrates a top plan view of an embodiment of a wafer at 1002 that includes barrier structures 1016 formed within peripheral edge region 1010. FIG. 10B illustrates a top plan view of an embodiment of a wafer at 1004 that includes barrier structures 1016 formed both within peripheral edge region 1010 and within interior region 1014.

Referring to FIG. 10A, barrier structures 1016A, 1016B, 1016C and 1016D illustrate different arrangements of barrier structures 1016 within peripheral edge region 1010. Barrier structures 1016A form a single contiguous column of barrier structures 1016, barrier structures 1016B form a double contiguous column of barrier structures 1016. Barrier structures 1016C extend between the inner boundary illustrated at 1006 and edge 1008. Barrier structures 1016D form a continuous boundary as corners of each barrier structure 1016D are contiguous. In other embodiments, other suitable arrangements of barrier structures 1016 may be used to form a boundary between the interior boundary illustrated at 1006 and edge 1008. In other embodiments, barrier structures 1016 can be formed within horizontal lines 1020 and vertical lines 1022. In these embodiments, horizontal lines 1020 are horizontal kerf lines 1020 and vertical lines 1022 are vertical kerf lines 1022.

In the illustrated embodiments, barrier structures 1016 form a contiguous boundary between edge 1008 and interior region 1014. In other embodiments, barrier structures 1016 do not form a contiguous boundary between edge 1008 and interior region 1014. In one exemplary embodiment, a first group of barrier structures 1016 forms a contiguous boundary within peripheral edge region 1010 and a second group of barrier structures 1016 forms a contiguous boundary within peripheral edge region 1010, and the first group of barrier structures 1016 is not contiguous with the second group of barrier structures 1016 (not illustrated).

Referring to FIG. 10B, barrier structures 1016 form a contiguous boundary within peripheral edge region 1010. Barrier structures 1016 are also formed around die illustrated at 1018 that are within interior region 1014. Barrier structures 1016 form a contiguous boundary within interior region 1014. In other embodiments, barrier structures 1016 can be formed within horizontal lines 1020 and vertical lines 1022. In these embodiments, horizontal lines 1020 are horizontal kerf lines 1020 and vertical lines 1022 are vertical kerf lines 1022.

Figure 11B:
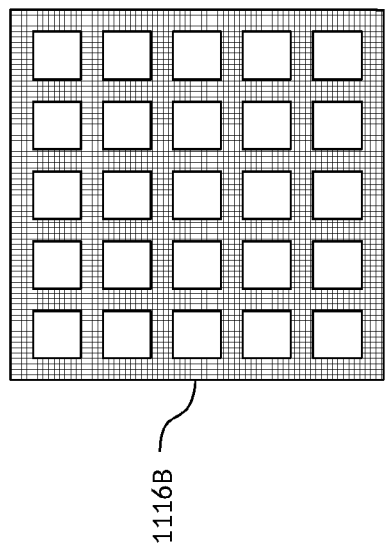
FIG. 11B illustrates a top plan view of an embodiment of a barrier structure that is formed using a reticle on a wafer substrate.
Figure 11D:
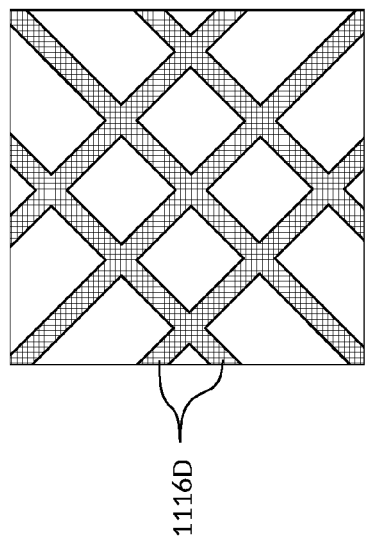
FIG. 11D illustrates a top plan view of an embodiment of a barrier structure that is formed using a reticle on a wafer substrate.
Figure 11A:
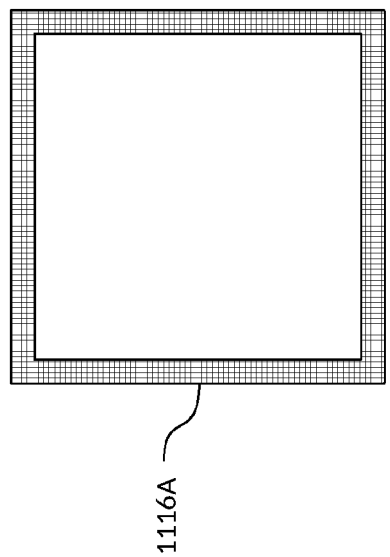
FIG. 11A illustrates a top plan view of an embodiment of a barrier structure that is formed using a reticle on a wafer substrate.
Figure 11C:
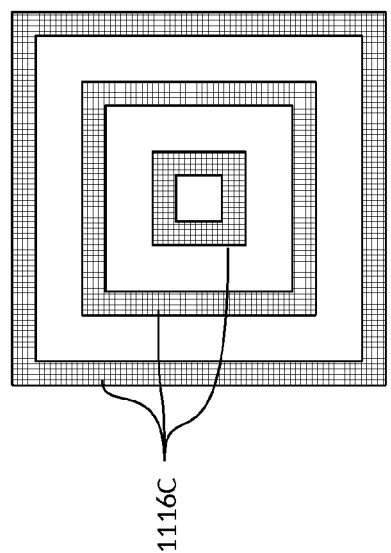
FIG. 11C illustrates a top plan view of an embodiment of a barrier structure that is formed using a reticle on a wafer substrate.

FIGS. 11A-11D illustrate top plan views, respectively, of embodiments of barrier structures 1116 that are formed using a reticle on a wafer substrate. FIG. 11A illustrates a barrier structure 1116A that includes a rectangular outline within the reticle area. FIG. 11B illustrates a barrier structure 1116B that includes a two-dimensional horizontal and vertical array within the reticle area. FIG. 110 illustrates a barrier structure 1116C that includes multiple concentric shapes within the reticle area. FIG. 11D illustrates a barrier structure 1116D that includes an angled two-dimensional horizontal array within the reticle area.

Figure 12:
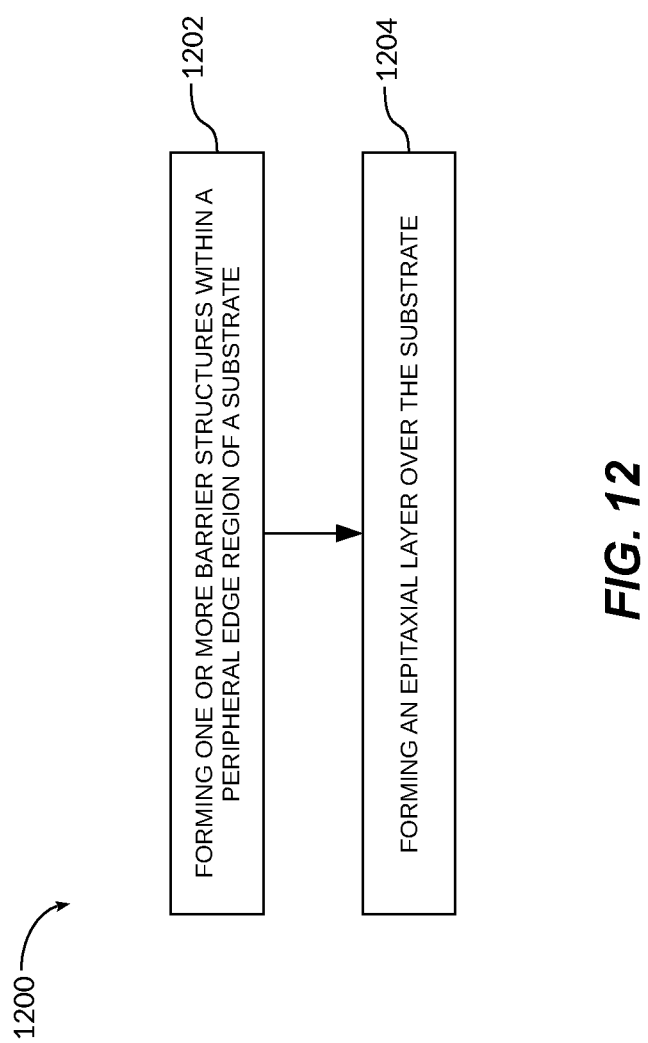
FIG. 12 illustrates a flowchart of an embodiment of a method of forming one or more barrier structures within a peripheral edge region of a substrate.

FIG. 12 illustrates a flowchart of an embodiment of a method of forming one or more barrier structures 416 within a peripheral edge region 410 of a substrate 402. The method is illustrated at 1200. At 1202, one or more barrier structures 416 are formed within peripheral edge region 410 of substrate 402. At 1204, an epitaxial layer 432 is formed over substrate 402.

Figure 13:
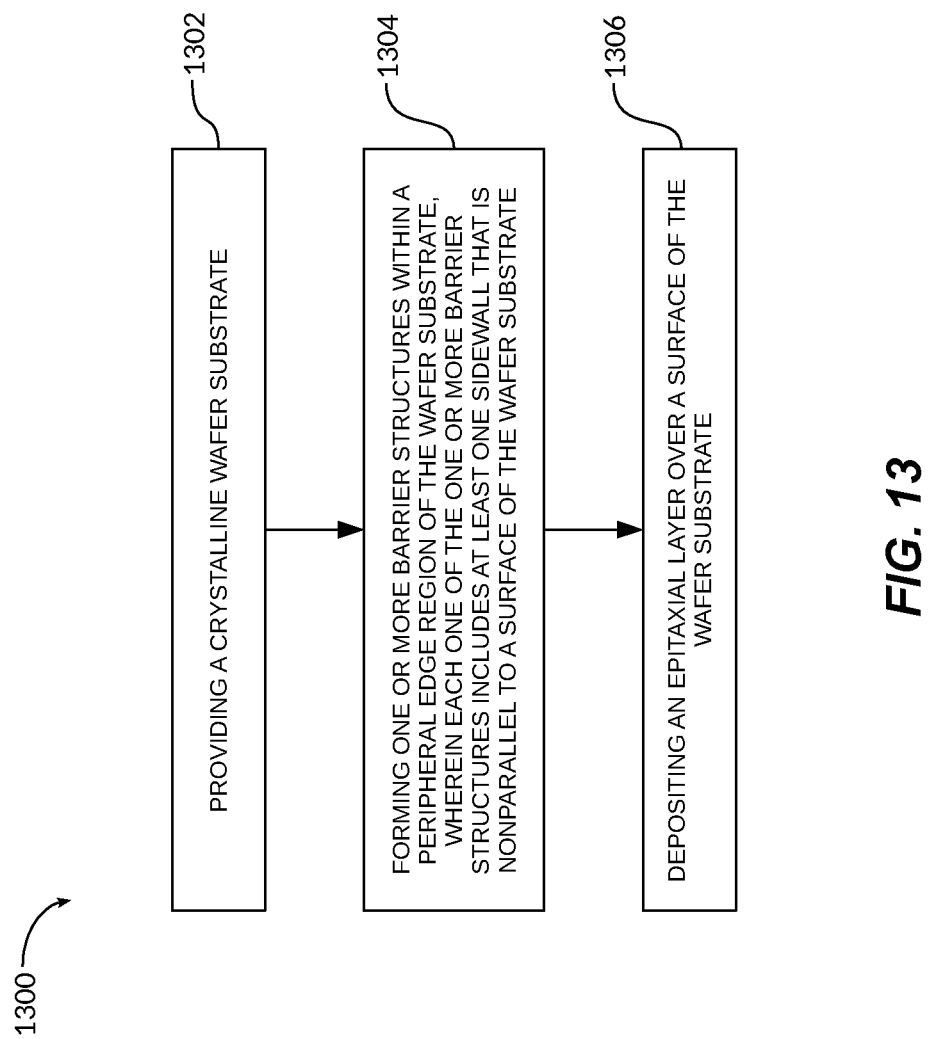
FIG. 13 illustrates a flowchart of an embodiment of a method of forming one or more barrier structures within a peripheral edge region of a wafer substrate.

FIG. 13 illustrates a flowchart of an embodiment of a method of forming one or more barrier structures 416 within a peripheral edge region 410 of a wafer substrate 402. The method is illustrated at 1300. At 1302, a crystalline wafer substrate 402 is provided. At 1304, one or more barrier structures 416 are formed within a peripheral edge region 410 of wafer substrate 402. Each one of the one or more barrier structures 416 includes at least one sidewall 422 that is nonparallel to a surface 404 of wafer substrate 402. At 1306, an epitaxial layer 432 is deposited over surface 404 of wafer substrate 402.

Although specific embodiments have been illustrated and described herein, it will be appreciated by those of ordinary skill in the art that a variety of alternate and/or equivalent implementations may be substituted for the specific embodiments shown and described without departing from the scope of the present invention. This application is intended to cover any adaptations or variations of the specific embodiments discussed herein. Therefore, it is intended that this invention be limited only by the claims and the equivalents thereof.

What is claimed is:

1. A method, comprising:
forming one or more edge defect termination structures around an edge of a substrate that are between the edge and an interior region of the substrate and within a peripheral edge region of the substrate, wherein the one or more edge defect termination structures include one or more trenches that each have a depth below a surface of the substrate and a sidewall facing the edge of the substrate that provides a barrier between the sidewall and the edge that prevents dislocation defects that originate between the sidewall and the edge from continuing to the interior region of the substrate; and
forming an epitaxial layer over a surface of the substrate.

2. The method of claim 1, wherein the epitaxial layer comprises a material selected from a group of materials consisting of Si, Ge, GaN, SiC and any combination of these materials.

3. The method of claim 1, wherein the epitaxial layer has a thickness that is between 5 microns and 200 microns, inclusive.

4. The method of claim 1, wherein the peripheral edge region has a width that is between 100 microns and 7 millimeters, inclusive.

5. The method of claim 1, wherein the substrate comprises a material selected from a group of materials consisting of Si, SiC, GaN, SiGe, SOI, GaAs and any combination of these materials.

6. The method of claim 1, wherein forming the epitaxial layer over the surface of the substrate comprises filling at least a portion of the one or more trenches with the epitaxial layer.

7. The method of claim 1, further comprising filling the one or more trenches with a material selected from a group of materials consisting of $Si_3N_4$, SiC, SiON, $SiO_2$, $Ta_2O_5$, $ZrO_2$, $Al_2O_3$, polysilicon, amorphous silicon, semi-insulating polysilicon, amorphous carbon and any combination of these materials.

8. The method of claim 1, further comprising filling the one or more trenches with a material having a thermal conductivity that is greater than the thermal conductivity of the substrate.

9. The method of claim 1, wherein forming the one or more edge defect termination structures further comprises covering the one or more trenches using a Venecia process to define one or more cavities within the substrate.

10. The method of claim 1, wherein forming the one or more edge defect termination structures further comprises:
filling at least a portion of the one or more trenches with a material selected from a group of materials consisting of $Si_3N_4$, SiC, SiON, $SiO_2$, $Ta_2O_5$, $ZrO_2$, $Al_2O_3$, polysilicon, amorphous silicon, semi-insulating polysilicon, amorphous carbon and any combination of these materials; and
covering the one or more trenches using a Venecia process.

11. The method of claim 1, wherein forming the one or more edge defect termination structures comprises forming one or more oxide structures on a top surface of the substrate and not within the one or more trenches, and wherein forming the epitaxial layer comprises forming the epitaxial layer over the one or more oxide structures.

12. The method of claim 1, wherein forming the one or more edge defect termination structures comprises forming one or more oxide structures on a top surface of the substrate and not within the one or more trenches, and wherein forming an epitaxial layer comprises forming a polycrystalline layer over the one or more oxide structures.

13. A method for reducing defects during epitaxial deposition, comprising:
providing a crystalline wafer substrate;
forming one or more edge defect termination structures around an edge of the wafer substrate that are between the edge and an interior region of the wafer substrate and within a peripheral edge region of the wafer substrate, wherein the one or more edge defect termination structures include one or more trenches that each have a depth below a surface of the wafer substrate and a sidewall facing the edge of the wafer substrate that is nonparallel to the surface that provides a barrier between the sidewall and the edge that prevents dislocation defects that originate between the sidewall and the edge from continuing to the interior region of the wafer substrate; and depositing an epitaxial layer over the surface of the wafer substrate.

14. The method of claim 13, wherein the wafer substrate comprises a material selected from a group of materials consisting of Si, SiC, GaN SiGe, SOI, GaAs and any combination of these materials.

15. The method of claim 13, further comprising filling the one or more trenches with a material selected from a group of materials consisting of $Si_3N_4$, SiC, SiON, $SiO_2$, $Ta_2O_5$, $ZrO_2$, $Al_2O_3$, polysilicon, amorphous silicon, semi-insulating polysilicon, amorphous carbon and any combination of these materials.

16. The method of claim 13, wherein forming the one or more edge defect termination structures further comprises covering the one or more trenches using a Venecia process to define one or more cavities within the wafer substrate.

17. The method of claim 13, wherein forming the one or more edge defect termination structures comprises forming one or more oxide structures on a top surface of the wafer substrate and not within the one or more trenches, and wherein forming the epitaxial layer comprises forming the epitaxial layer over the one or more oxide structures.

18. The method of claim 17, wherein the one or more oxide structures comprise a material selected from a group of materials consisting of $SiO_2$, SiON, $Ta_2O_5$, $Al_2O_3$, $Ga_2O_3$, $In_2O_3$, $SnO_2$, $TiO_2$, amorphous carbon, graphite, diamond-like carbon and any combination of these materials.

* * * * *